United States Patent
Kirby et al.

(10) Patent No.: US 7,354,863 B2
(45) Date of Patent: Apr. 8, 2008

(54) METHODS OF SELECTIVELY REMOVING SILICON

(75) Inventors: Kyle K. Kirby, Boise, ID (US); Kevin J. Torek, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 141 days.

(21) Appl. No.: 10/804,366

(22) Filed: Mar. 19, 2004

(65) Prior Publication Data

US 2005/0208766 A1 Sep. 22, 2005

(51) Int. Cl.
*H01L 21/311* (2006.01)

(52) U.S. Cl. .................. 438/700; 438/753; 257/E21.25; 257/E21.569

(58) Field of Classification Search ............... 438/690, 438/700–701, 745, 753, 749–751, 462–463; 257/E21.25, E21.569
See application file for complete search history.

(56) References Cited

U.S. PATENT DOCUMENTS

| | | | |
|---|---|---|---|
| 4,113,551 A | 9/1978 | Bassous et al. | |
| 5,071,510 A | 12/1991 | Findler et al. | |
| 5,466,389 A | 11/1995 | Ilardi et al. | |
| 5,565,060 A | 10/1996 | Austin et al. | |
| 6,103,598 A | 8/2000 | Yamagata et al. | |
| 6,403,289 B1 | 6/2002 | Tanaka et al. | |
| 6,465,403 B1 | 10/2002 | Skee | |
| 6,468,951 B1 | 10/2002 | Grieger et al. | |
| 6,534,458 B1 | 3/2003 | Kakizawa et al. | |
| 6,599,683 B1 | 7/2003 | Torek et al. | |
| 6,912,081 B2 * | 6/2005 | Bolle et al. ................ 359/295 |
| 6,927,146 B2 * | 8/2005 | Brask et al. ............... 438/458 |
| 2003/0073299 A1* | 4/2003 | Mashino .................... 438/597 |
| 2004/0256734 A1* | 12/2004 | Farnworth et al. ......... 257/777 |
| 2005/0065050 A1* | 3/2005 | Starzynski ................. 510/175 |
| 2005/0077913 A1* | 4/2005 | Watkins et al. ............ 324/754 |
| 2005/0104228 A1* | 5/2005 | Rigg et al. ................. 257/786 |

FOREIGN PATENT DOCUMENTS

JP 641770 * 2/1994

OTHER PUBLICATIONS

"Sachem, Spec Sheet, 379—Tetramethylammonium Hydroxide, 6% in Propylene Glycol," Mar. 27, 1997, 1 page.
U.S. Appl. No. 10/684,621, filed Oct. 14, 2003, entitled, "Compliant Contact Structures, Contactor Cards and Test System Including Same, and Methods of Fabrication and Use".
U.S. Appl. No. 10/791,195, filed Mar. 2, 2004, entitled, "Compliant Contact Pin Assembly, Card System and Methods Thereof".

* cited by examiner

*Primary Examiner*—Thanhha S. Pham
(74) *Attorney, Agent, or Firm*—TraskBritt

(57) ABSTRACT

An etch solution that comprises tetramethylammonium hydroxide ("TMAH") and at least one organic solvent. The etch solution may be substantially free of water. The etch solution is formulated to selectively etch a silicon layer relative to other layers on an integrated circuit. The TMAH may be present in an amount ranging from approximately 1% by weight to approximately 10% by weight. The at least one organic solvent may be selected from the group consisting of isopropanol, butanol, hexanol, phenol, glycol, glycerol, ethylene glycol, propylene glycol, glycerin, and mixtures thereof. A method of selectively etching a silicon layer and a method of removing a heat-affected zone ("HAZ") on an integrated circuit are also disclosed.

15 Claims, 4 Drawing Sheets

METHODS OF SELECTIVELY REMOVING SILICON

FIELD OF THE INVENTION

The present invention relates to a composition and method of etching silicon and, more specifically, relates to a composition and method of selectively etching silicon without etching metal, oxide, or nitride materials.

BACKGROUND OF THE INVENTION

Semiconductor devices, from microprocessors to memory chips, are fabricated by performing a complex series of processes that include depositing various materials and selectively masking and etching one or more materials on portions of a semiconductor wafer or other bulk semiconductor substrate. Silicon is a conductive material that is commonly used as a semiconductor substrate in a semiconductor device, such as in an integrated circuit. Ideally, etching selectively removes or etches portions of the semiconductor substrate without damaging or removing other portions. In a wet etch process, a wet etch solution is typically applied to a surface of the semiconductor substrate. Reactants in the wet etch solution adsorb to the surface of the semiconductor substrate and react with the silicon surface. After the reaction has occurred, reaction byproducts desorb from the surface of the semiconductor substrate and are solubilized in the wet etch solution, removing portions of the semiconductor substrate. For instance, in a typical wet etch process of a semiconductor substrate formed from silicon, the reactants in the wet etch solution react with the silicon, forming an oxide layer on the surface of the silicon semiconductor substrate. The oxide layer is subsequently dissolved, effectively etching the surface of the silicon semiconductor substrate.

Etchants or wet etch solutions that etch silicon are typically aqueous solutions of alkaline bases, such as potassium hydroxide (KOH), sodium hydroxide (NaOH), lithium hydroxide (LiOH), or tetramethylammonium hydroxide ("TMAH"). U.S. Pat. No. 4,113,551 to Bassous et al. discloses an aqueous TMAH solution that selectively etches silicon relative to silicon dioxide ($SiO_2$), poly $SiO_2$, or phosphosilicate glass. U.S. Pat. No. 6,103,598 to Yamagata et al. discloses an aqueous TMAH solution that selectively etches porous monocrystalline silicon relative to $SiO_2$. U.S. Pat. No. 5,565,060 to Austin et al. discloses an aqueous TMAH solution that includes a high flash point alcohol and selectively etches silicon relative to p-doped silicon. One example of a solution for etching silicon is BakerClean® JTB-111, which is available from J. T. Baker (Phillipsburg, N.J.). Solutions having ammonium fluoride, phosphoric acid, hydrogen peroxide, and deionized water have also been used to etch silicon. However, these etchants also aggressively etch other materials, such as metals, oxides, polyimides, or nitrides, which are commonly present on the substrate as portions of an integrated circuit being fabricated thereon. Therefore, if the integrated circuit includes metal features, these features are corroded or otherwise damaged by the etchant. Since these etchants are not particularly selective for silicon, they are not well suited for etching silicon when features formed from other materials are present on the substrate.

Aqueous TMAH solutions have also been used to clean metallic or organic contamination from semiconductor substrates, as disclosed in U.S. Pat. No. 6,465,403 to Skee. The cleaning solution includes TMAH, a water-soluble, metal ion-free silicate, a chelating agent and, optionally, a water-soluble organic solvent or a surfactant. Similarly, U.S. Pat. No. 5,466,389 to Ilardi et al. discloses an aqueous cleaning solution that includes TMAH, a nonionic surfactant, and a compound that reduces a pH of the cleaning solution to 8-10. U.S. Pat. No. 6,534,458 to Kakizawa et al. ("Kakizawa") discloses an aqueous cleaning solution that includes TMAH, a nonionic surfactant, and an organic solvent. The cleaning solution is used to remove impurities that are absorbed onto copper wiring on a semiconductor substrate.

TMAH has also been used in photoresist compositions and photoresist developer compositions. For instance, U.S. Pat. No. 6,599,683 to Torek et al. discloses a photoresist developer that includes a polyhydric alcohol, such as propylene glycol, a base compound, such as TMAH, a surfactant, and water.

BRIEF SUMMARY OF THE INVENTION

The present invention relates to an etch solution comprising TMAH and at least one organic solvent. The etch solution is formulated to selectively etch a silicon layer relative to at least one of a metal layer, an oxide layer, a polyimide layer, and a nitride layer. The TMAH may be present in an amount ranging from approximately 1% by weight to approximately 10% by weight. The at least one organic solvent of the etch solution may comprise at least one hydroxyl group that is capable of dissociating and forming at least one hydroxyl ion. The at least one organic solvent may be selected from the group consisting of isopropanol, butanol, hexanol, phenol, glycol, glycerol, ethylene glycol, propylene glycol, glycerin, and mixtures thereof. The etch solution may be substantially free of water. In one embodiment, the etch solution comprises approximately 6% TMAH and approximately 94% propylene glycol.

The present invention also comprises a method of selectively etching silicon. The method comprises exposing a silicon layer on a semiconductor substrate to an etch solution comprising TMAH and at least one organic solvent. The silicon layer is removed without removing at least one of a metal layer, an oxide layer, a nitride layer, and a polyimide layer also present on the semiconductor substrate. The TMAH may be present in an amount ranging from approximately 1% by weight to approximately 10% by weight. The at least one organic solvent of the etch solution may comprise at least one hydroxyl group that is capable of dissociating and forming at least one hydroxyl ion. The at least one organic solvent may be selected from the group consisting of isopropanol, butanol, hexanol, phenol, glycol, glycerol, ethylene glycol, propylene glycol, glycerin, and mixtures thereof. The etch solution may be substantially free of water. In one embodiment, the etch solution comprises approximately 6% TMAH and approximately 94% propylene glycol.

The present invention also relates to a method of removing a heat-affected zone ("HAZ") on a silicon substrate on which an integrated circuit is being fabricated. The HAZ may be formed in a portion of a silicon substrate, such as by laser ablating the portion of the silicon substrate to remove silicon therefrom such as, for example and without limitation, to form a via therethrough. The HAZ may be removed without removing at least one of a metal layer, an oxide layer, a nitride layer, and a polyimide layer also present on the silicon substrate. The HAZ may be removed by exposing the silicon substrate to an etch solution comprising TMAH and at least one organic solvent. The TMAH may be present in the etch solution in an amount ranging from approximately 1% by weight to approximately 10% by weight. The at least one organic solvent of the etch solution may comprise at least one hydroxyl group that is capable of dissociating and forming at least one hydroxyl ion. The at least one organic solvent may be selected from the group consisting of isopropanol, butanol, hexanol, phenol, glycol, glycerol, ethylene glycol, propylene glycol, glycerin, and mixtures thereof. The etch solution may be substantially free of water. In one embodiment, the etch solution comprises approximately 6% TMAH and approximately 94% propylene glycol. The etch solution may also be used to remove at least another portion of the silicon substrate outside the HAZ without removing at least one of the metal layer, the oxide layer, the nitride layer, or the polyimide layer.

The present invention also comprises a method of removing a HAZ from a blind opening. The method comprises providing a semiconductor substrate having a HAZ in a blind opening thereon and removing the HAZ without removing at least one of a metal layer, an oxide layer, a nitride layer, and a polyimide layer on the semiconductor substrate. The HAZ may be removed with an etch solution comprising TMAH and at least one organic solvent. The TMAH may be present in the etch solution in an amount ranging from approximately 1% by weight to approximately 10% by weight. The at least one organic solvent of the etch solution may comprise at least one hydroxyl group that is capable of dissociating and forming at least one hydroxyl ion. The at least one organic solvent may be selected from the group consisting of isopropanol, butanol, hexanol, phenol, glycol, glycerol, ethylene glycol, propylene glycol, glycerin, and mixtures thereof. The etch solution may be substantially free of water. In one embodiment, the etch solution comprises approximately 6% TMAH and approximately 94% propylene glycol.

The present invention also comprises a method of forming an aperture in a through-wafer interconnect. The method comprises exposing a silicon substrate to a laser beam to form an aperture, wherein the laser beam forms a HAZ on the silicon substrate. The silicon substrate is exposed to an etch solution comprising TMAH and at least one organic solvent to remove the HAZ without removing at least one of a metal layer, an oxide layer, a nitride layer, and a polyimide layer present on the silicon substrate. The TMAH may be present in the etch solution in an amount ranging from approximately 1% by weight to approximately 10% by weight. The at least one organic solvent of the etch solution may comprise at least one hydroxyl group that is capable of dissociating and forming at least one hydroxyl ion. The at least one organic solvent may be selected from the group consisting of isopropanol, butanol, hexanol, phenol, glycol, glycerol, ethylene glycol, propylene glycol, glycerin, and mixtures thereof. The etch solution may be substantially free of water. In one embodiment, the etch solution comprises approximately 6% TMAH and approximately 94% propylene glycol.

The present invention also comprises a method of forming a through-wafer interconnect. The method comprises exposing a silicon substrate to a laser beam to form an aperture, wherein the laser beam forms a HAZ on the silicon substrate. The HAZ is removed without removing at least one of a metal layer, an oxide layer, a nitride layer, and a polyimide layer present on the silicon substrate and the aperture is filled with a conductive material to form a through-wafer interconnect. The HAZ is removed by exposing the silicon substrate to an etch solution comprising TMAH and at least one organic solvent. The TMAH may be present in the etch solution in an amount ranging from approximately 1% by weight to approximately 10% by weight. The at least one organic solvent of the etch solution may comprise at least one hydroxyl group that is capable of dissociating and forming at least one hydroxyl ion. The at least one organic solvent may be selected from the group consisting of isopropanol, butanol, hexanol, phenol, glycol, glycerol, ethylene glycol, propylene glycol, glycerin, and mixtures thereof. The etch solution may be substantially free of water. In one embodiment, the etch solution comprises approximately 6% TMAH and approximately 94% propylene glycol.

BRIEF DESCRIPTION OF THE SEVERAL VIEWS OF THE DRAWINGS

While the specification concludes with claims particularly pointing out and distinctly claiming that which is regarded as the present invention, the advantages of this invention may be more readily ascertained from the following description of the invention when read in conjunction with the accompanying drawings in which:

DETAILED DESCRIPTION OF THE INVENTION

Figure 1:
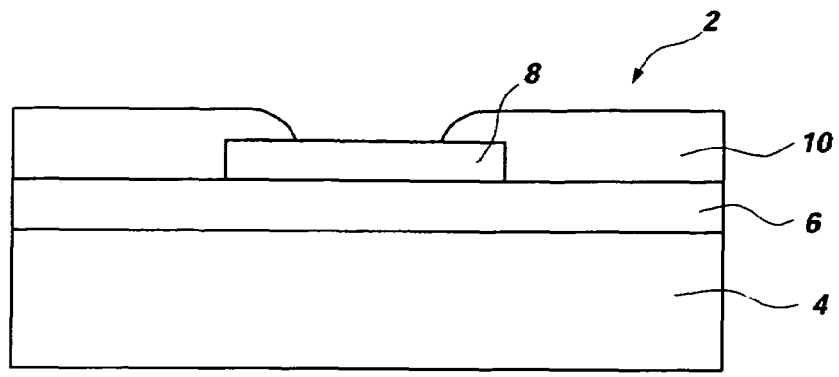
FIGS. 1-6 schematically illustrate a cross-sectional view of an embodiment of an integrated circuit in which a through-wafer-interconnect is formed.
Figure 2:
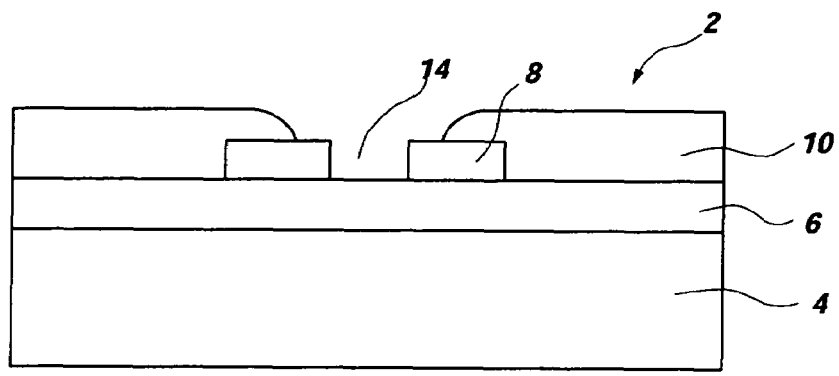
Figure 3:
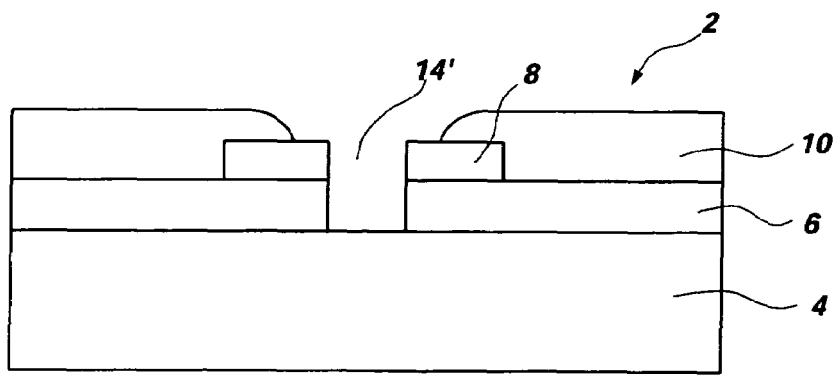

An etch solution that includes TMAH and at least one organic solvent is disclosed. The etch solution may be used to selectively etch or remove a silicon layer from a substrate without etching or removing other materials on the substrate. As used herein, the term "silicon layer" refers to a layer or feature formed from silicon including, but not limited to, monocrystalline silicon or polycrystalline silicon ("polysilicon"). The etch solution may selectively etch the silicon layer without removing or etching other layers or features on the substrate, such as metal, oxide, polyimide, or nitride layers. Instead of TMAH, the etch solution may also utilize additional tetraalkylammonium hydroxides including, but not limited to, tetraethylammonium hydroxide. In addition, mixtures of tetraalkylammonium hydroxides may be used, such as mixtures of tetraethylammonium hydroxide and TMAH. The etch solution may etch the silicon layer at a rate that is commercially viable for removing the silicon layer, such as from approximately 0.5 µm/min to approximately 10 µm/min. Furthermore, the etch solution may preferentially etch the silicon layer or may isotropically etch polysilicon.

The organic solvent used in the etch solution may be a solvent or a mixture of solvents having at least one hydroxyl group and within which the TMAH is at least partially soluble. The organic solvent may be mostly anhydrous, such as having less than approximately 50% by weight ("wt %") of water. As explained below, silicon reaction products produced by the etch process may also be soluble in the organic solvent. The hydroxyl group may be capable of dissociating from the organic solvent. The organic solvent may also have a boiling point that is higher than a temperature at which the etch process is performed, which allows the etch solution to be used at an elevated temperature without the organic solvent evaporating. The organic solvent may be an alcohol or a mixture of alcohols, such as a straight chain alcohol, branched alcohol, cyclic alcohol, aromatic alcohol, or mixtures thereof. The organic solvent may also be an ester, an ether, or mixtures thereof. The organic solvent may include, but is not limited to, methanol, ethanol, isopropanol, butanol, hexanol, phenol, glycol, glycerol, ethylene glycol, propylene glycol ("PG"), glycerin, or mixtures thereof. In one embodiment, the organic solvent is PG. The organic solvent may be present in the etch solution from approximately 90 wt % of a total weight of the etch solution to approximately 99 wt % of a total weight of the etch solution.

The tetraalkylammonium hydroxide may be present in the etch solution from approximately 1 wt % of a total weight of the etch solution to approximately 10 wt % of a total weight of the etch solution. For instance, if TMAH is used as the tetraalkylammonium hydroxide, the TMAH may be present in the etch solution from approximately 1 wt % of a total weight of the etch solution to approximately 10 wt % of a total weight of the etch solution. In one embodiment, the etch solution includes approximately 6 wt % TMAH. However, higher or lower amounts or concentrations of TMAH may be used depending on a desired etch rate of the silicon layer and a desired selectivity for silicon. For instance, at TMAH concentrations ranging from approximately 7 wt % to approximately 8 wt %, the silicon etch rate may be decreased compared to the etch rate obtained with approximately 6 wt % TMAH. However, the selectivity of the etch solution for silicon relative to other materials may be increased. Conversely, lower concentrations of TMAH, such as concentrations below approximately 6 wt %, may provide an increased silicon etch rate relative to the etch rate obtained with 6 wt % TMAH but a decreased selectivity for silicon.

The concentration of TMAH in the etch solution may thus be increased or decreased depending on a manufacturer's tolerance for defects on the integrated circuit being fabricated, which defects may be caused by the etch solution. For instance, if the etch solution includes lower concentrations of TMAH, corrosion of other layers in the integrated circuit, such as the metal layers, may occur. On the other hand, if quality is a primary concern and reduced throughput is acceptable, a higher TMAH concentration may be employed. As such, depending on the acceptable tolerance for defects, the etch solution may include a TMAH concentration that is higher or lower than the range of TMAH concentrations described above. In other words, if the manufacturer is less sensitive to collateral damage to circuit features that may be caused by the etch solution, lower amounts of TMAH may be used, while a higher quality structure may result from the use of higher amounts of TMAH.

In one embodiment, the etch solution includes approximately 6% TMAH and approximately 94% PG. This formulation of TMAH and PG is available from Sachem, Inc. (Austin, Tex.) as product #379.

The etch solution may optionally include surfactants, antifoaming agents, or agents for odor control, depending on the desired properties of the etch solution. The surfactant may be an anionic surfactant, a cationic surfactant, a nonionic surfactant, or mixtures thereof.

To increase the silicon etch rate, the etch solution may also include water. However, the presence of water may undesirably increase damage to the other materials on the integrated circuit being fabricated. For instance, the water may corrode metal layers or features of the integrated circuit. In one embodiment, the etch solution is substantially free of water, such as having less than approximately 0.25 wt % of water.

As discussed previously, the integrated circuit being fabricated may include other layers or features, such as layers formed from metal, oxide, polyimide, or nitride materials. These layers may be substantially unaffected by the etch solution. In other words, the etch solution may not substantially etch, remove, or damage metal, oxide, polyimide, or nitride materials and, therefore, is selective for the silicon layer. The metal material may include, but is not limited to, aluminum (Al), titanium (Ti), copper (Cu), nickel (Ni), tantalum nitride (TaN), titanium nitride (TiN), tungsten (W), cobalt (Co), silver (Ag), or aluminum-titanium alloys (Al—Ti). The oxide material may include, but is not limited to, $SiO_2$, a low silane oxide ("LSO"), or tetraethylorthosilicate ("TEOS"). The polyimide material may include, but is not limited to, polybenzoxazole or Durimid™, which is available from Rogers Corp. (Rogers, Conn.). The nitride material may include, but is not limited to, $Si_3N_4$, boron nitride (BN), or aluminum oxynitride ($AlO_xN_y$), which may be deposited by plasma-enhanced chemical vapor deposition ("PECVD").

Without being tied to a particular theory, it is believed that at least one of the hydroxyl groups present on at least one of the organic solvent or the TMAH dissociates and forms a hydroxyl ion ($OH^-$). The hydroxyl ion and the TMAH may then react with the silicon layer to form a silicon reaction product that is soluble in the organic solvent. For sake of example only, the silicon reaction product may be a complexed solute, such as $Si(OH)_2^{2-}$ or $SiO_2(OH)_2^{2-}$. Since the silicon reaction product is soluble in the organic solvent, the silicon layer may be etched away after it is exposed to the etch solution.

The silicon layer may be exposed by the etch solution by immersing the substrate of the integrated circuit under fabrication in a bath that contains the etch solution. Alternatively, the etch solution may be sprayed or spincoated onto the substrate so that it contacts the silicon layer. After a desired portion of the silicon layer has been etched by the etch solution, the substrate may be rinsed, such as with water.

The etch solution may be applied to the substrate for an amount of time sufficient to remove the desired portion of the silicon layer. The amount of time may range from approximately a few minutes to approximately a few hours, depending on the desired portion of the silicon layer to be removed and a temperature at which the etch process is performed. For instance, if a small portion or depth of the silicon layer is to be removed, the etch solution may be applied to the silicon layer for a few minutes. However, if substantially all of the silicon layer is to be removed, the etch solution may be applied for a few hours, such as from approximately 1 hour to approximately 3 hours. The etch process may be performed at room temperature (approximately 25° C.) or at an elevated temperature to increase the silicon etch rate and, thus, reduce the amount of time needed to etch the silicon layer. The etch solution may be maintained at room temperature or may be heated, such as to a temperature ranging from approximately 105° C. to approximately 150° C. Since the organic solvent in the etch solution has a boiling point higher than the temperature at which the etch process is performed, the etch solution may be heated without evaporating the organic solvent. The etch solution may be heated by placing the etch solution in a bath or soak tank that is configured with a variable heat setting. Alternatively, the integrated circuit may be heated and then the etch solution sprayed or spincoated onto the integrated circuit. If the organic solvent has a low boiling point, such as methanol, ethanol, or isopropanol, and the etch process is to be performed at a temperature higher than the organic solvent's boiling point, a system enabling etching of the substrate at an atmospheric pressure above ambient may be used to increase the silicon etch rate.

The selective etch of the silicon layer may also be achieved using supercritical carbon dioxide ($CO_2$) and at least one co-solvent, such as the etch solution described above.

The etch solution including TMAH and the at least one organic solvent may also be used in combination with conventional silicon etch solutions. For instance, the silicon layer may be etched with the etch solution including TMAH and the at least one organic solvent. Then, the etched silicon layer may be smoothed with a conventional etch solution that includes ammonium fluoride, phosphoric acid, water, hydrogen peroxide, and at least one organic solvent, such as PG. In addition to smoothing the etched silicon layer, this conventional etch solution may remove $SiO_2$. A conventional etch solution may also be used to decap or remove a native oxide from the silicon layer. In this situation, the conventional etch solution may be a dilute, aqueous solution of hydrogen fluoride. The silicon layer may then be etched with the etch solution including TMAH and the at least one organic solvent, as previously described.

In one embodiment, the etch solution including TMAH and the at least one organic solvent may be used to remove a HAZ from a through-wafer-interconnect ("TWI"). As used herein, the phrase "HAZ" refers to an area of heat-damaged silicon in a silicon layer of a semiconductor substrate and the phrase "through-wafer-interconnect" refers to a conductive via in an integrated circuit. A TWI extends through the thickness of a silicon substrate and a conductive filling thereof is used to electrically connect the integrated circuit on one side of the silicon substrate to another component or apparatus on the opposing side. As such, the TWI provides a conductive path. The TWI is also known in the art as a via or a feedthrough. The integrated circuit 2 may include a silicon substrate 4, an oxide layer 6, a metal bond pad 8, and a nitride layer 10, as shown in FIG. 1. The silicon substrate 4, the oxide layer 6, the metal bond pad 8, and the nitride layer 10 may be formed by conventional techniques and, as such, are not described in detail herein. In one embodiment, the silicon substrate 4 has a crystal orientation that allows for selectively etching as an isotropic etch, the metal bond pad 8 is formed from aluminum (Al), the oxide layer 6 is $SiO_2$, and the nitride layer 10 is $Si_3N_4$.

Figure 4:
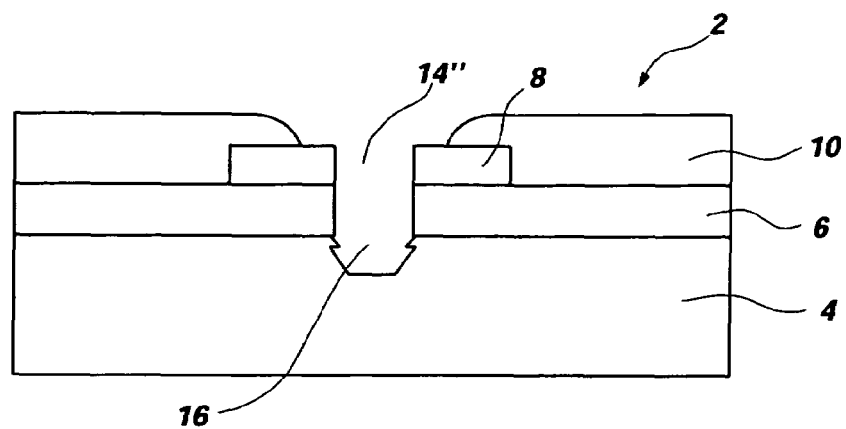
Figure 5:
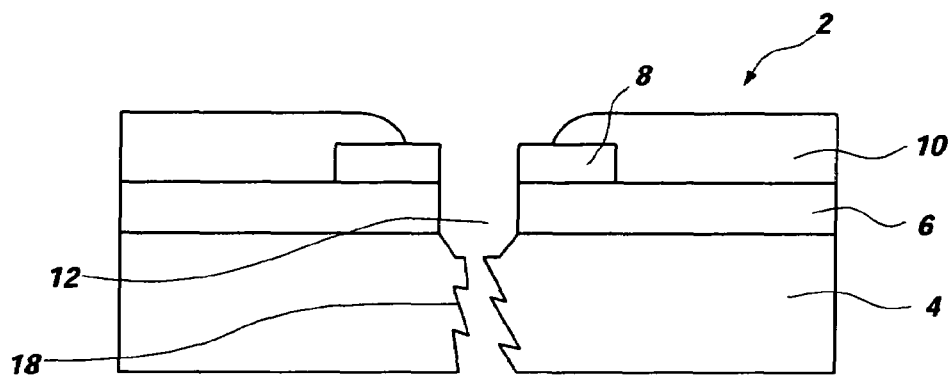
Figure 6:
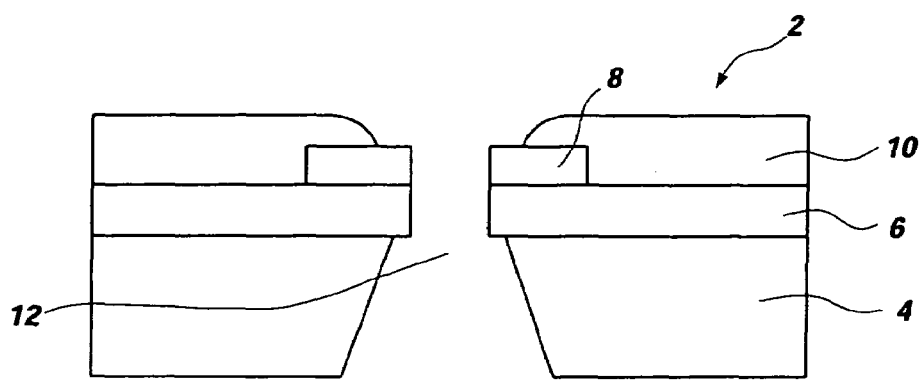
Figure 7:
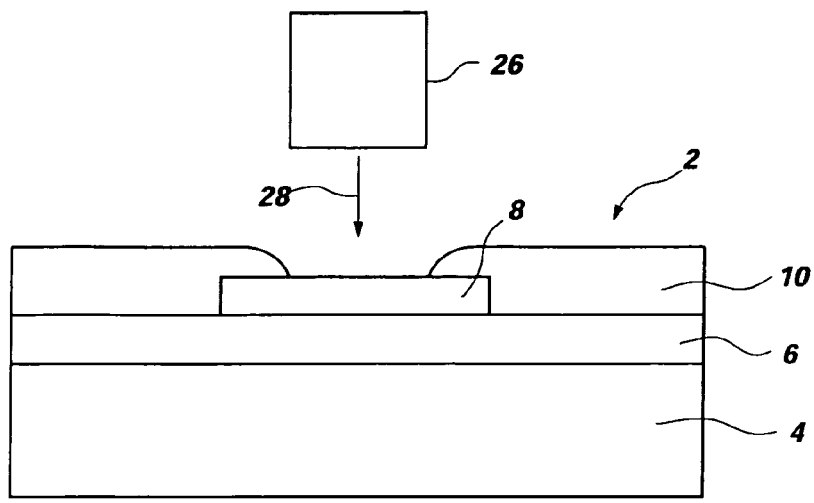
FIG. 7 schematically illustrates a laser.

An aperture 12, to be used as a TWI when conductively filled, may be formed in the integrated circuit 2, as shown in FIGS. 2-6. An opening segment 14 may be etched through the metal bond pad 8 and then extended as segment 14' through the oxide layer 6 to the silicon substrate 4, as known in the art. Each of the solutions used to etch the opening segments 14, 14' in the metal bond pad 8 and the oxide layer 6 may be conventional etch solutions and, therefore, are not discussed in detail herein. The silicon substrate 4 may then be exposed to a conventional etch solution for an amount of time sufficient to decap or remove native oxide on the silicon substrate 4. For sake of example only, the conventional etch solution may be an aqueous solution of dilute hydrogen fluoride. The opening segments 14, 14' may then be extended through the silicon substrate 4 as opening segment 14" by laser ablating a portion of the silicon substrate 4. As schematically shown in FIG. 7, a laser 26 may be used to extend the opening segments 14, 14' by directing the laser beam 28 at either, or both, surfaces of the silicon substrate 4. Alternatively, as shown in FIG. 4, a dimple 16 may be etched in the silicon substrate 4, providing a buffer zone towards which the laser beam 28 is subsequently directed. In such an instance, the silicon substrate 4 may first be exposed to the aqueous solution of dilute hydrogen fluoride to decap native oxide on the silicon substrate 4. Then, an etch solution of the present invention including TMAH and the at least one organic solvent may be applied for an amount of time sufficient to form the dimple 16 in the silicon substrate 4. The laser beam 28 may then be directed toward the dimple 16, extending the opening segments 14, 14' to form the aperture 12.

Energy of the laser beam 28 may ablate a desired portion of the silicon substrate 4, extending the opening segments 14, 14' and forming the aperture 12. However, the energy from the laser 26 may unduly heat the silicon substrate 4 surrounding the aperture 12 and also produce a HAZ 18, which is an area of damaged silicon surrounding the aperture 12. The material of the HAZ 18 is commonly referred to as a "slag" and may include silicon and oxygen. If the HAZ 18 is not removed, the aperture 12 may have an insufficient width or diameter to form the necessary conductive path. Therefore, the etch solution including TMAH and the organic solvent may be applied to the integrated circuit 2 to selectively etch the HAZ 18 without damaging the metal bond pad 8, the oxide layer 6, or the nitride layer 10. The etch solution may be applied to the integrated circuit 2 for an amount of time sufficient to etch the HAZ 18, such as from approximately 1 hour to approximately 3 hours to substantially remove the HAZ 18. Once the HAZ 18 is removed, the aperture 12 may have a substantially uniform width and a substantially square or oblong cross-sectional shape depending on the crystallographic orientation of silicon substrate 4. For the sake of example only, the aperture 12 may have a width ranging from approximately 10 μm to approximately 100 μm. A length of the aperture 12 may depend on a thickness of the silicon substrate 4.

Figure 9:
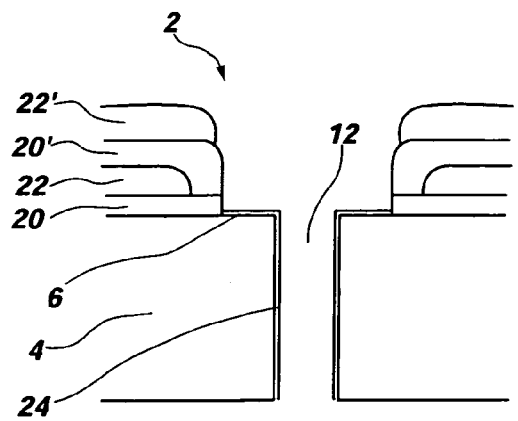

Depending on the amount of time that the integrated circuit 2 is exposed to the etch solution, a portion of the silicon substrate 4 outside, or behind, HAZ 18 may also be etched. As such, the diameter of the aperture 12 may be increased by varying the amount of time to which the integrated circuit 2 is exposed to the etch solution. As shown in FIG. 6, the silicon substrate 4 may be undercut so that sidewalls of the aperture 12 are protected from additional etch processes. In other words, the metal bond pad 8 masks and protects the sidewalls of the aperture 12. However, as shown in FIG. 9 and discussed below, the etch solution may also be used to remove the HAZ 18 without substantially etching the surrounding portions of silicon substrate 4. Therefore, the etch solution may be used to selectively remove the HAZ 18 relative to the metal bond pad 8, the oxide layer 6, or the nitride layer 10, to selectively remove silicon relative to the metal bond pad 8, the oxide layer 6, or the nitride layer or both.

The laser 26 used to ablate the aperture 12 for the TWI may be a conventional laser having an appropriate power, wavelength, and frequency to ablate the silicon of silicon substrate 4. For the sake of example only, the laser may be a pulsed or continuous KrF laser, a $CO_2$ laser, a Ruby laser, a YAG laser, or a Nd:YAG laser, such as a 248 nanometer ("nm") wavelength KrF excimer laser or a 355 nm wavelength pulse laser. To produce the aperture 12 having a desired shape and desired width or diameter, the power, duration, and beam focus of the laser may be selected as known in the art.

After the HAZ 18 has been removed, the aperture 12 may be filled with a conductive material including, but not limited to, a metal, a metal alloy, a conductive polymeric material, or a conductive material embedded in a polymeric material to complete the TWI. The conductive material forms a conductive path from one surface of the silicon substrate 4 to the other, opposing surface of the silicon substrate 4, spanning the thickness of the silicon substrate 4. The conductive material may include, but is not limited to, nickel (Ni), cobalt (Co), copper (Cu), silver (Ag), aluminum (Al), titanium (Ti), iridium (Ir), gold (Au), tungsten (W), tantalum (Ta), molybdenum (Mo), platinum (Pt), palladium (Pd), a nickel-phosphorus (NiP) alloy, a palladium-phosphorus (Pd—P) alloy, a cobalt-phosphorus (Co—P) alloy, a cobalt-tungsten-phosphorus (Co—W—P) alloy, other alloys of the foregoing metals, and mixtures of the foregoing metals. The conductive material may also include a solder material, such as a tin/lead material. The conductive material may be deposited in the aperture 12 by a conventional technique, such as by electroless deposition or electroplating. Alternatively, the walls of aperture 12 may first be coated with a seed layer, such as a thin layer of Ni, Cu, W, Ti, Pd, tin (Sn), a polysilicon, $Si_3N_4$, or titanium nitride (TiN) by chemical vapor deposition ("CVD"), PECVD, physical vapor deposition ("PVD"), vacuum evaporation, or sputtering. The conductive material may then be deposited over the seed layer. The material used in the seed layer and the deposition process used to deposit the seed layer may be selected by one of ordinary skill in the art depending on the conductive material that is to be used.

Figure 8:
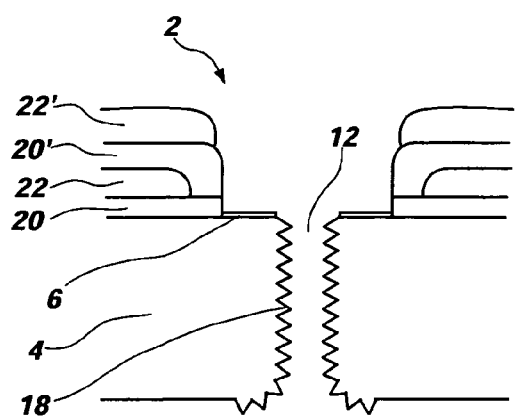
FIGS. 8 and 9 schematically illustrate a cross-sectional view of another embodiment of an integrated circuit in which a through-wafer-interconnect is formed.

In another embodiment, the integrated circuit 2 may include the silicon substrate 4, the oxide layer 6, metal layers 20, 20', polyimide layers 22, 22', and the HAZ 18, as shown in FIGS. 8-9. The HAZ 18 surrounding aperture 12 may be removed using the etch solution including TMAH and the at least one organic solvent. However, the silicon substrate 4, the oxide layer 6, the metal layers 20, 20', and the polyimide layers 22, 22' may be substantially unaffected by the etch solution. A passivation layer 24 may be formed on the sidewalls of the silicon substrate 4, isolating the silicon substrate 4 from the conductive material used to fill the aperture 12 used to complete the TWI, as shown in FIG. 9. The passivation layer 24 may be formed from an insulative or a dielectric material, such as spin-on-glass, thermal oxide, Parylene™ polymer, $SiO_2$, $Si_3N_4$, silicon oxynitride, a glass, i.e., borophosphosilicate glass, phosphosilicate glass or borosilicate glass, or any dielectric having a low dielectric constant known by those of ordinary skill in the art. The passivation layer 24 may be formed to a desired thickness using a conventional technique for depositing the material including, but not linited to, CVD, PVD, low pressure chemical vapor deposition ("LPCVD"), rapid thermal nitridation ("RTN"), a spin-on-glass ("SOG") process, or flow coating. The passivation layer 24 may range from approximately 1 μm to approximately 5 μm in thickness. The passivation layer 24 may also be formed from an insulating polymer, such as BT resin, a polyimide, benzocyclobutene, or polybenzoxazole, which may be deposited using an injection or capillary process or a vacuum draw. After the passivation layer 24 is formed, the aperture 12 may be filled with the conductive material, as described above to form the TWI.

Figure 10:
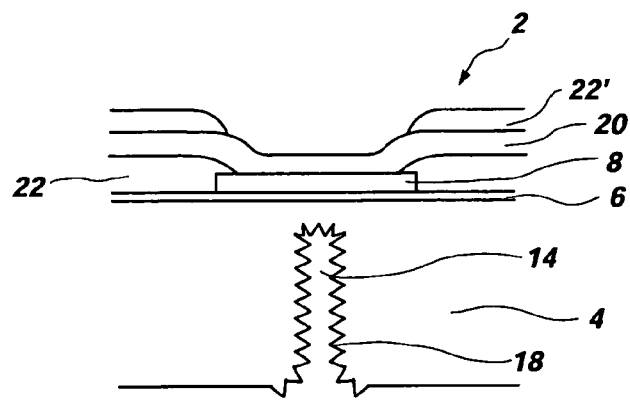
FIGS. 10-12 schematically illustrate a cross-sectional view of another embodiment of an integrated circuit in which a through-wafer-interconnect is formed.
Figure 11:
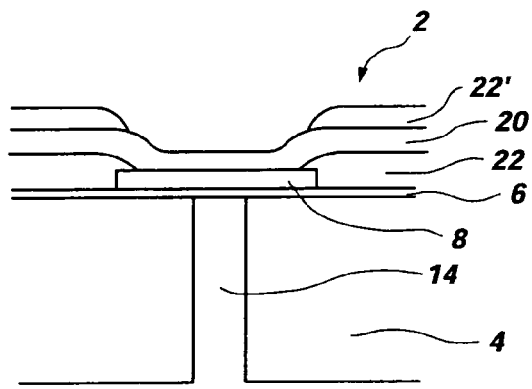
Figure 12:
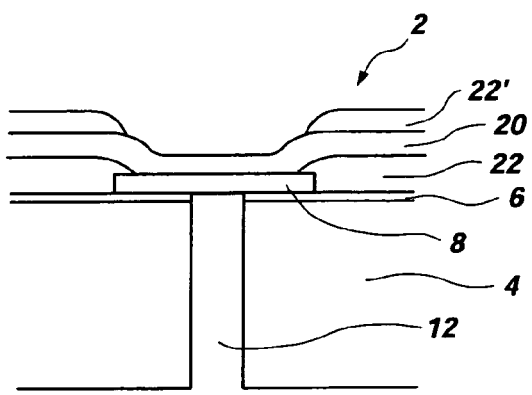

In another embodiment, the etch solution of the present invention may be used to remove the HAZ 18 from a blind hole, as shown in FIGS. 10-12. The integrated circuit 2 may include a silicon substrate 4, an oxide layer 6, a metal bond pad 8, a metal layer 20, polyimide layers 22, 22', and the HAZ 18 surrounding opening segment 14 formed by laser ablation, as shown in FIG. 10. The HAZ 18 may be removed using the etch solution including TMAH and the at least one organic solvent. In addition to removing the HAZ 18, the etch solution may also remove a portion of the silicon substrate 4, stopping on the oxide layer 6. A conventional etch solution may then be used to smooth the silicon substrate 4. The conventional etch solution may include ammonium fluoride, phosphoric acid, water, hydrogen peroxide, and at least one organic solvent, such as PG. In addition to smoothing the etched silicon layer, the conventional etch solution may remove the oxide layer 6, exposing the metal bond pad 8. However, the conventional etch solution may not damage or etch the metal bond pad 8. The resulting aperture 12 may then be filled with the conductive material, as described above, to complete the TWI.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of selectively etching silicon, comprising:
exposing a silicon layer on a semiconductor substrate to an etch solution consisting of tetramethylammonium hydroxide ("TMAH") and at least one organic solvent selected from the group consisting of isopropanol, butanol, hexanol, glycol, glycerol, propylene glycol, ethylene glycol, glycerin, and mixtures thereof; and
removing the silicon layer without removing at least one of an exposed oxide layer, an exposed nitride layer, and an exposed polyimide layer also present on the semiconductor substrate.

2. The method of claim 1, wherein exposing the silicon layer on the semiconductor substrate to the etch solution consisting of TMAH and the at least one organic solvent selected from the group consisting of isopropanol, butanol, hexanol, glycol, glycerol, propylene glycol, ethylene glycol, glycerin, and mixtures thereof comprises exposing the silicon layer to the etch solution consisting of TMAH and propylene glycol.

3. The method of claim 1, wherein exposing the silicon layer on the semiconductor substrate to the etch solution consisting of TMAH and the at least one organic solvent selected from the group consisting of isopropanol, butanol, hexanol, glycol, glycerol, propylene glycol, ethylene glycol, glycerin, and mixtures thereof comprises exposing the silicon layer to the etch solution consisting of from approximately 1% by weight to approximately 10% by weight of TMAH.

4. The method of claim 1, wherein exposing the silicon layer on the semiconductor substrate to the etch solution consisting of TMAH and the at least one organic solvent selected from the group consisting of isopropanol, butanol, hexanol, glycol, glycerol, propylene glycol, ethylene glycol, glycerin, and mixtures thereof comprises exposing the silicon layer to the etch solution consisting of approximately 6% by weight of TMAH.

5. The method of claim 1, wherein exposing the silicon layer on the semiconductor substrate to the etch solution consisting of TMAH and the at least one organic solvent selected from the group consisting of isopropanol, butanol, hexanol, glycol, glycerol, propylene glycol, ethylene glycol, glycerin, and mixtures thereof comprises exposing the silicon layer to the etch solution consisting of approximately 6% TMAH and approximately 94% propylene glycol.

6. A method of removing a heat-affected zone ("HAZ") on a semiconductor substrate, comprising:
removing a HAZ on a silicon substrate without removing at least one of an exposed oxide layer and an exposed nitride layer present on the silicon substrate by exposing the silicon substrate to an etch solution comprising tetramethylammonium hydroxide ("TMAH") and at least one organic solvent selected from the group consisting of isopropanol, butanol, hexanol, phenol, glycol, glycerol, ethylene glycol, glycerin, and mixtures thereof; and
smoothing at least a portion of the silicon substrate with a second etch solution comprising ammonium fluoride, phosphoric acid, water, hydrogen peroxide, and at least one organic solvent.

7. The method of claim 6, wherein removing the HAZ on the silicon substrate comprises removing the HAZ formed by laser ablation.

8. The method of claim 6, further comprising removing at least a portion of the silicon substrate other than within the HAZ using the etch solution.

9. A method of forming an aperture in a through-wafer interconnect, comprising:
exposing a silicon substrate to a laser beam to form an aperture, wherein the laser beam forms a heat-affected zone ("HAZ") on the silicon substrate;
exposing the silicon substrate to an etch solution comprising tetramethylammonium hydroxide ("TMAH") and at least one organic solvent selected from the group consisting of isopropanol, butanol, hexanol, phenol, glycol, glycerol, ethylene glycol, glycerin, and mixtures thereof;
removing the HAZ without removing at least one of an exposed oxide layer, an exposed nitride layer, and an exposed polyimide layer present on the silicon substrate; and
removing at least a portion of the silicon substrate with a second etch solution comprising ammonium fluoride, phosphoric acid, water, hydrogen peroxide, and at least one organic solvent.

10. The method of claim 9, further comprising filling the aperture with a conductive material to form a through-wafer interconnect.

11. The method of claim 9, further comprising removing at least a portion of the silicon substrate with the etch solution.

12. A method of forming a through-wafer interconnect, comprising:
exposing a silicon substrate to a laser beam to form an aperture, wherein the laser beam forms a heat-affected zone ("HAZ") on the silicon substrate;
removing the HAZ without removing at least one of an exposed oxide layer and an exposed nitride layer present on the silicon substrate by exposing the silicon substrate to a first etch solution comprising tetramethylammonium hydroxide ("TMAH") and at least one organic solvent selected from the group consisting of isopropanol, butanol, hexanol, phenol, glycol, glycerol, ethylene glycol, glycerin, and mixtures thereof;
filling the aperture with a conductive material to form a through-wafer interconnect; and
removing at least a portion of the silicon substrate with a second etch solution comprising ammonium fluoride, phosphoric acid, water, hydrogen peroxide, and at least one organic solvent.

13. The method of claim 12, further comprising removing the at least a portion of the silicon substrate with the second etch solution to enlarge a diameter of the aperture.

14. The method of claim 12, further comprising smoothing the at least a portion of the silicon substrate with the second etch solution comprising ammonium fluoride, phosphoric acid, water, hydrogen peroxide, and at least one organic solvent.

15. The method of claim 12, further comprising forming a passivation layer on sidewalls of the aperture before filling the aperture with the conductive material.

* * * * *